(12) United States Patent
Asada et al.

(10) Patent No.: US 7,977,731 B2
(45) Date of Patent: Jul. 12, 2011

(54) NOR FLASH MEMORY AND METHOD OF MANUFACTURING THE SAME

(75) Inventors: Kazuhiro Asada, Yokohama (JP); Hideyuki Yamawaki, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 187 days.

(21) Appl. No.: 12/336,907

(22) Filed: Dec. 17, 2008

(65) Prior Publication Data

US 2009/0159956 A1 Jun. 25, 2009

(30) Foreign Application Priority Data

Dec. 25, 2007 (JP) ................................. 2007-332716

(51) Int. Cl.
*H01L 27/115* (2006.01)
(52) U.S. Cl. ........ 257/321; 257/314; 257/315; 257/322; 257/E27.103
(58) Field of Classification Search .................. 257/321, 257/314, 315, 322, E27.103
See application file for complete search history.

(56) References Cited

U.S. PATENT DOCUMENTS

| 5,190,887 | A | 3/1993 | Tang et al. |
| 5,907,781 | A | 5/1999 | Chen et al. |
| 2006/0234448 | A1 * | 10/2006 | Yonehama et al. ........... 438/257 |
| 2006/0258108 | A1 | 11/2006 | Hironaka et al. |
| 2007/0164341 | A1 * | 7/2007 | Sakagami ..................... 257/314 |

FOREIGN PATENT DOCUMENTS

| JP | 2002-508589 | 3/2002 |
| JP | 2006-303009 | 11/2006 |

* cited by examiner

*Primary Examiner* — Ngan Ngo
*Assistant Examiner* — Benjamin Tzu-Hung Liu
(74) *Attorney, Agent, or Firm* — Oblon, Spivak, McClelland, Maier & Neustadt, L.L.P.

(57) ABSTRACT

A NOR flash memory has a plurality of memory cell transistors, wherein each memory cell transistor shares the source diffusion layer with another memory cell transistor adjacent thereto on one side thereof in the column direction and shares the drain diffusion layer with another memory cell transistor adjacent thereto on the other side thereof in the column direction, and the width of the source diffusion layer in the column direction is narrower than the width of the drain diffusion layer in the column direction.

2 Claims, 9 Drawing Sheets

(A) A-A' CROSS SECTION  (B) B-B' CROSS SECTION  (C) C-C' CROSS SECTION (A) A-A' CROSS SECTION  (B) B-B' CROSS SECTION  (C) C-C' CROSS SECTION (A) A-A' CROSS SECTION  (B) B-B' CROSS SECTION  (C) C-C' CROSS SECTION (A) A-A' CROSS SECTION  (B) B-B' CROSS SECTION  (C) C-C' CROSS SECTION (A) A-A' CROSS SECTION  (B) B-B' CROSS SECTION  (C) C-C' CROSS SECTION

NOR FLASH MEMORY AND METHOD OF MANUFACTURING THE SAME

CROSS-REFERENCE TO RELATED APPLICATION

This application is based upon and claims the benefit of priority from the prior Japanese Patent Application No. 2007-332716, filed on Dec. 25, 2007, the entire contents of which are incorporated herein by reference.

BACKGROUND OF THE INVENTION

1. Field of the Invention

The present invention relates to a NOR nonvolatile semiconductor storage device having a source electrode of a local interconnection type and a method of manufacturing the same. In particular, it is applied to formation of a source region and a drain region that have a self-aligned contact structure.

2. Background Art

Improvement of the performance of semiconductor integrated circuits has led to development of microprocessors and bulk semiconductor memories and thus has made a contribution to advancement of the information society.

A nonvolatile semiconductor memory can be electrically written or erased and maintain data even after the power supply is turned off. The nonvolatile semiconductor memory, which has increased its storage capacity, is now dominating the conventional magnetic recording media, such as hard disks, in the storage media market.

Downsizing of semiconductor integrated circuits has made a great contribution to such advancement of the technology. And the downsizing of semiconductor integrated circuits is based on the photolithography technique. The photolithography technique has recently achieved a resolution of the order of nanometers and is expected to achieve even finer resolutions.

The photolithography technique involves a scanner that projects a desired pattern of light onto a photoresist applied on a semiconductor wafer for exposure and an exposure mask having a fine pattern referred to as reticle. In the photolithography technique, patterning of a contact hole is particularly difficult.

A transistor, which is an essential component of an integrated semiconductor circuit, has fine diffusion layers referred to as drain region and source region. To form wiring, contacts have to be formed through the fine diffusion layers and a contact hole or a local interconnection groove formed in an interlayer insulating film.

In particular, the contact hole connected to the drain region has to be reliably formed on the fine diffusion layer without forming a short circuit to an adjacent bit.

In the following, a memory cell array of a NOR flash memory will be described in particular.

The memory cell array of the NOR flash memory is composed of memory cells "MC" arranged in a matrix. Bit lines "BL" extend in the column direction of the memory cell array, and word lines "WL" and source lines "LI" extend in the row direction of the memory cell array.

In the memory cell array, the memory cells "MC" in each column are connected in series with each other so that adjacent memory cells share a source region and a drain region. That is, adjacent memory cells "MC" are arranged to share a source region and a drain region. Each bit line "BL" forms a drain contact layer "DC" together with the drain regions of the memory cells "MC" in one column. Each word line "WL" extends in the row direction and forms a common connection for one row of memory cells "MC" together with the control gate electrodes of the memory cells "MC".

Therefore, the memory cell array of the NOR flash memory has to have one drain contact layer "DC" for connection to the bit line "BL" for every two memory cells. To this end, drain contact layers "DC" are periodically arranged in the memory cell array.

The drain contact layer "DC" is formed between the word line "WL" and a device isolation region, and higher precision of the drain contact holes is needed as the memory cells become smaller. Thus, higher machining precision of the memory cell array is needed.

However, from the viewpoint of reducing the contact resistance, the opening of the contact holes is preferably as large as possible. To this end, it is essential that the contact holes have the largest allowable opening.

The contact hole actually formed depends on the capability of the scanner and the photoresist, the capability of the etching apparatus, and finally the implantability of the region.

On the other hand, the source line "LI" extends in the row direction and forms a common connection for one row of the memory cell array.

The source region differs from the drain region in the relationship with the adjacent bits in the row direction. More specifically, the drain region has to be isolated from the adjacent bits in the row direction. To the contrary, the source region has only to be connected to the ground potential, and therefore, there is no problem if the source region is connected to the adjacent source region in the row direction.

Thus, the ground potential is supplied from the source wiring in the upper layer through a via that relays the source potential every several tens or several hundreds of bits.

The structure of the source region of the NOR memory cell is generally classified as the local interconnection (LI) type that obtains the ground potential from the source wiring in the upper layer through local interconnection wiring or the self-aligned source (SAS) type that obtains the ground potential via the adjacent cells through the diffusion layer (see National Publication of International Patent Application No. 2002-508589, for example).

For both the structures described above, the distance between the gate electrode and the drain contact layer has to be enough to achieve a required breakdown voltage and accommodate the misalignment of the lithography apparatus.

In the case of the LI type, in addition, the distance between the gate electrode and the source local interconnection wiring also has to be enough to achieve the required breakdown voltage and accommodate the misalignment.

On the other hand, the memory cell of the SAS type does not need consideration of the source side and can be downsized accordingly.

The most effective way of reducing the total area of a chip is to reduce the size of the memory cell array. However, reducing the size of each memory cell is not always the best way.

For example, supposing that the LI-type memory cell and the SAS-type memory cell are manufactured by the same manufacturing apparatus, the size of the memory cell itself is smaller for the SAS type than the LI type. However, the SAS type is supplied with the source potential at the diffusion layer having a high electrical resistance and therefore requires frequent supplies of the ground potential.

On the other hand, for the LI-type cell, the ground potential of the metal wiring layer in the upper layer can be supplied to the source diffusion layer via tungsten or the like. Therefore, the LI-type cell requires a smaller number of supply points than the SAS type.

Furthermore, for source potential supply of the SAS type, the word line has to be curved to prevent electrical contact between the source contact and the word line. Then the pitch of the word line increases.

To the contrary, for source potential supply of the LI type, the source potential can be supplied in a two-dimensional manner, so that the area required for supply of the source potential can be reduced compared with the SAS type.

Therefore, for a large-scale memory cell array, the LI type can be smaller than the SAS type, although individual memory cells of the LI type are larger than those of the SAS type.

SUMMARY OF THE INVENTION

According to one aspect of the present invention, there is provided: a NOR flash memory, comprising:

a semiconductor substrate;

device isolation regions that extend in a column direction, are arranged at predetermined intervals in a row direction and separate device forming regions of the semiconductor substrate from each other;

a plurality of memory cell transistors that has a tunnel insulating film formed on the semiconductor substrate, a gate electrode that is formed to extend in the row direction and pass across the tunnel insulating film and the device isolation regions, a drain diffusion layer formed in a device forming region of the semiconductor substrate, and a source diffusion layer formed in the device forming region of the semiconductor substrate on the opposite side of the gate electrode to the drain diffusion layer;

a first contact plug formed in a self-aligned manner to be connected to the drain diffusion layer of the memory cell transistor;

a bit line that extends in the column direction and is connected to the first contact plug;

local interconnection wiring that is formed in a self-aligned manner to extend in the row direction and to be connected to the source diffusion layer of the memory cell transistor; and a common source line connected to the local interconnection wiring, wherein each memory cell transistor shares the source diffusion layer with another memory cell transistor adjacent thereto on one side thereof in the column direction and shares the drain diffusion layer with another memory cell transistor adjacent thereto on the other side thereof in the column direction, and the width of the source diffusion layer in the column direction is narrower than the width of the drain diffusion layer in the column direction.

According to the other aspect of the present invention, there is provided: a method of manufacturing a NOR flash memory, comprising:

forming device isolation regions that extend in a column direction and separate device forming regions of a semiconductor substrate from each other;

forming gate electrodes arranged in the column direction alternately at a first interval and a second interval narrower than the first interval to pass across the device isolation regions and the device forming regions;

forming a drain diffusion layer in a device forming region of the first interval and forming a source diffusion layer in a device forming region of the second interval;

forming an interlayer insulating film on the gate electrodes, the source diffusion layer and the drain diffusion layer;

forming a contact hole penetrating through the drain diffusion layer by etching the interlayer insulating film in a self-aligned manner with respect to the gate electrode using a first resist pattern having a hole-like opening as a mask;

forming a local interconnection groove penetrating through the source diffusion layer to pass across the device isolation regions and the device forming regions by etching the interlayer insulating film in a self-aligned manner with respect to the gate electrode using a second resist pattern having a groove-like opening the width in the column direction of which is narrower than the width in the column direction of the opening of the first resist pattern as a mask; and forming a contact plug connected to the drain diffusion layer in the contact hole and local interconnection wiring connected to the source diffusion layer in the local interconnection groove.

DETAILED DESCRIPTION

A semiconductor integrated circuit has a contact hole to interconnect an impurity region, which is formed by doping a semiconductor substrate with an impurity of a conductive type (an impurity element that imparts the n-type or p-type property to the semiconductor substrate), and a wire.

Figure 1A:
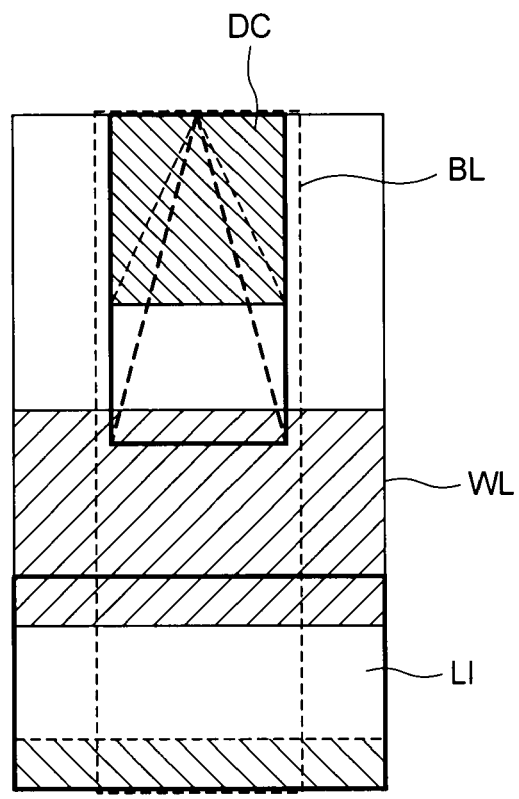
FIG. 1A is a plan view of a local-interconnection-type (LI-type) memory cell according to an embodiment of the present invention.
Figure 1B:
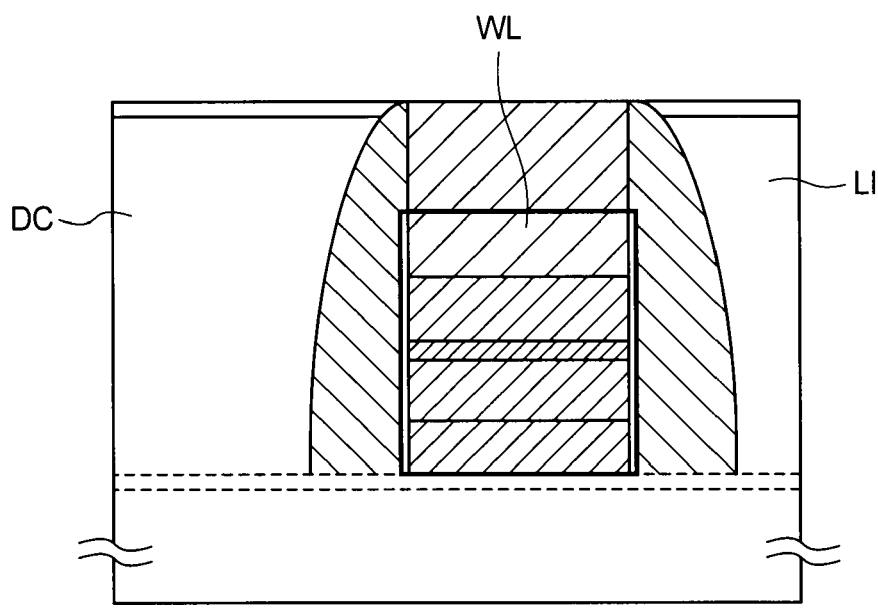
FIG. 1B is a cross-sectional view of the memory cell shown in FIG. 1A.

FIG. 1A is a plan view of a local-interconnection-type (LI-type) memory cell according to an embodiment of the present invention. FIG. 1B is a cross-sectional view of the memory cell shown in FIG. 1A.

In this embodiment, as shown in FIGS. 1A and 1B, there will be illustrated a structure in which gate electrodes are arranged alternately at a first interval and at a second interval narrower than the first interval, that is, arranged asymmetrically, so that a contact hole on the drain side is larger than a local interconnection groove on the source side and a manufacturing process therefor.

In this embodiment, to further downsize the LI-type memory cell, the self-aligned contact (SAC) is also used. Furthermore, the gate electrode is located toward the LI as far as the formation thereof is possible and the gate electrode has an enough breakdown voltage, so that the memory cell has an asymmetrical structure having a wider area on the side of the drain contact "DC" layer.

In the following, an embodiment of the present invention will be described with reference to the drawings.

Embodiment 1

Figure 2:
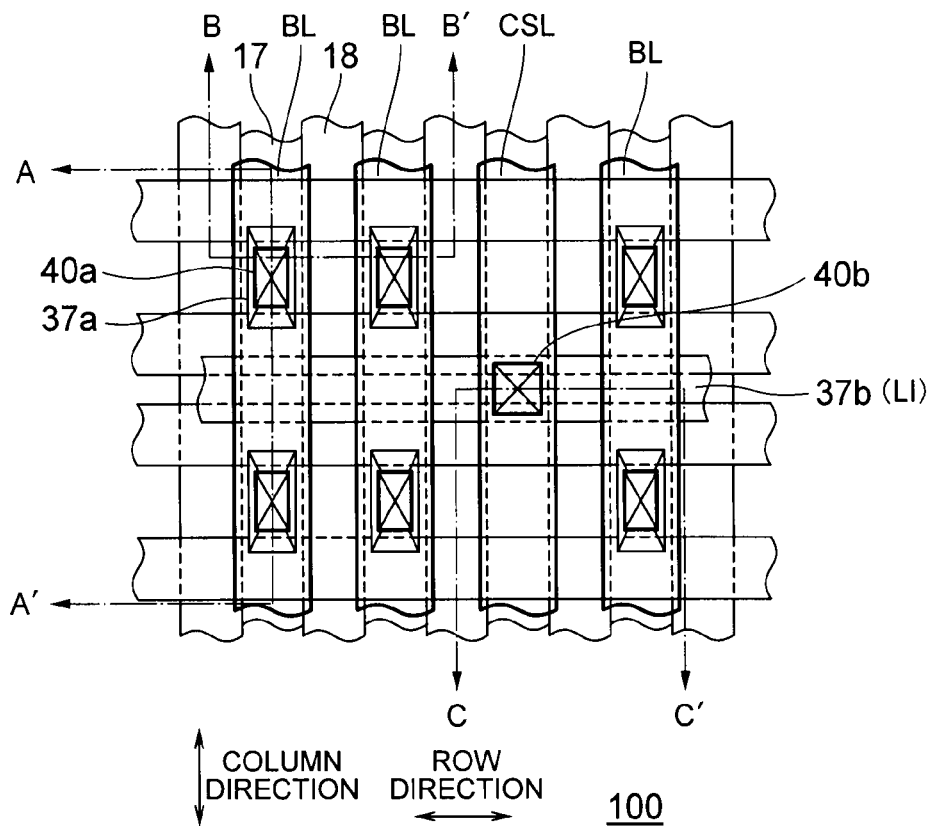
FIG. 2 is a top plan view showing a configuration of a memory cell array of a NOR flash memory 100 according to an embodiment 1, which is an aspect of the present invention.
Figure 3:
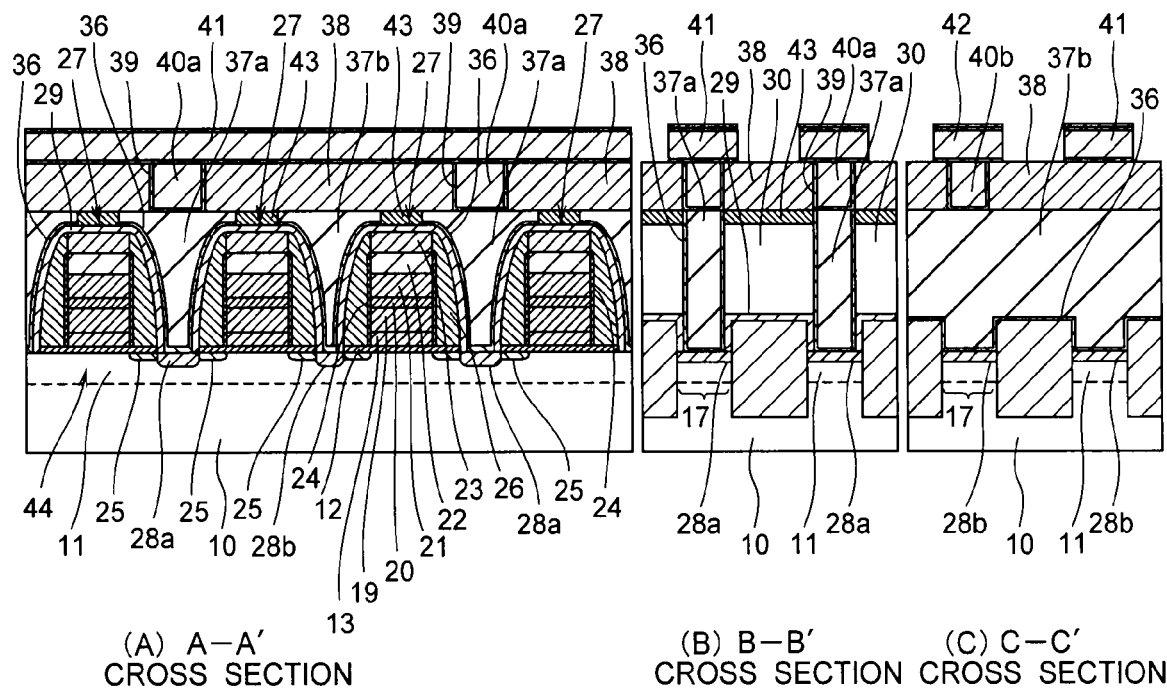
FIG. 3 is a cross-sectional view of the memory cell array of the NOR flash memory 100 shown in FIG. 2.
Figure 4:
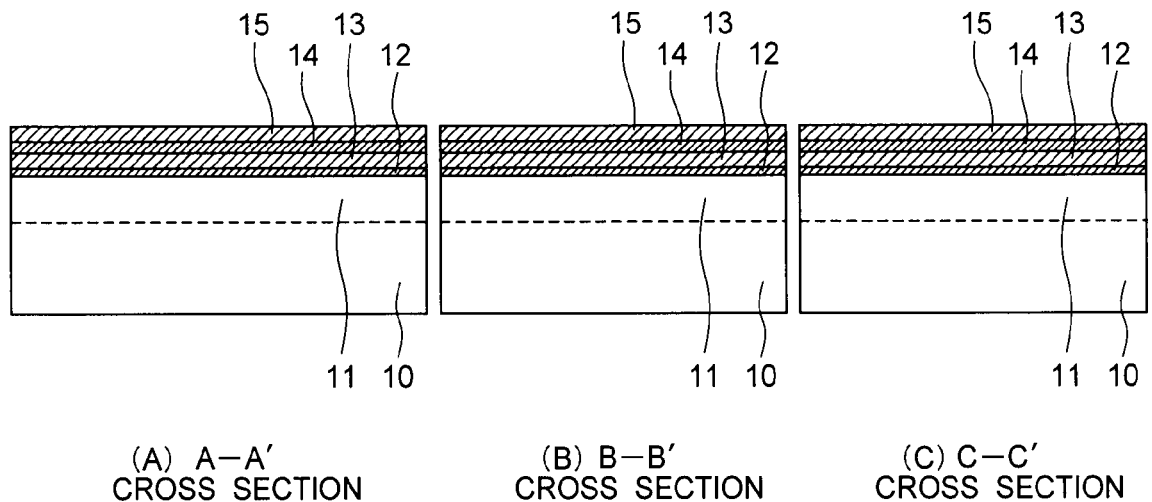
FIG. 4 is a cross-sectional view for illustrating a step of a method of manufacturing the NOR flash memory 100 according to the embodiment 1.
Figure 5:
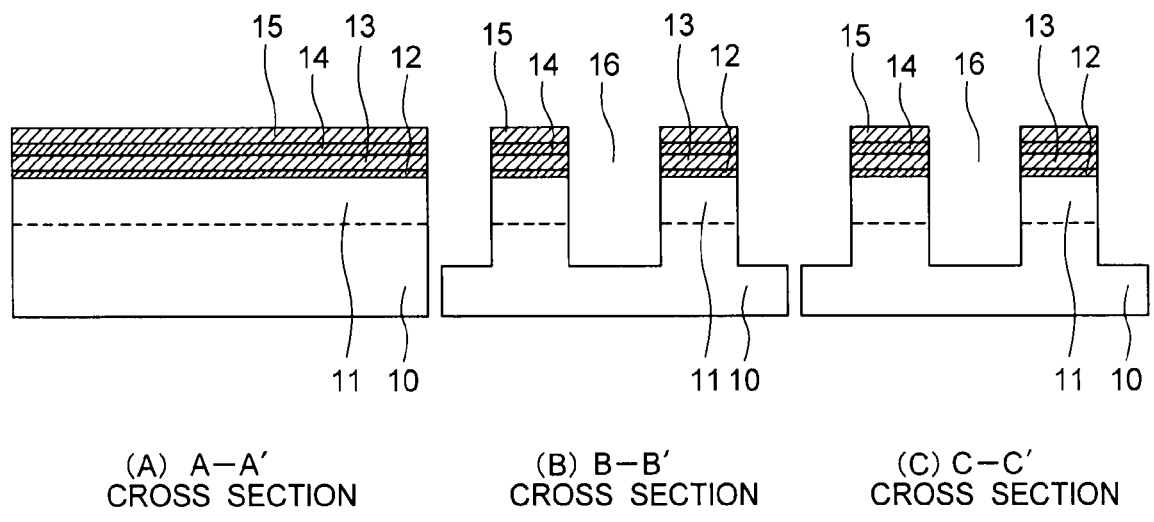
FIG. 5 is a cross-sectional view for illustrating a step of the method of manufacturing the NOR flash memory 100 according to the embodiment 1 and is continuous with FIG. 4.

FIG. 2 is a top plan view showing a configuration of a memory cell array of a NOR flash memory 100 according to an embodiment 1, which is an aspect of the present invention. FIGS. 3 are cross-sectional views of the memory cell array of the NOR flash memory 100 shown in FIG. 2.

Of FIGS. 3, FIG. 3(A) is a cross-sectional view taken along the line A-A' in FIG. 2 (showing a cross-sectional structure in the channel length direction of the memory cell), FIG. 3(B) is a cross-sectional view taken along the line B-B' (showing a cross-sectional structure of a drain contact of the memory cell), and FIG. 3(C) is a cross-sectional view taken along the line C-C' (showing a cross-sectional structure of a source local interconnection of the memory cell).

As shown in FIGS. 2 and 3, the NOR flash memory 100 has a semiconductor substrate 10, a device isolation region (device isolation insulating film) 18 that extends in the column direction and separates device forming regions 17 of the semiconductor substrate 10, a plurality of memory cell transistors 44, a first contact plug 37a, local interconnection wiring 37b ("LI"), a bit line 41 ("BL"), a common source line 42 ("CSL"), and a word line "WL".

The device forming region 17 includes a channel region of the memory cell and an impurity region of one conductive type in which a drain diffusion layer 28a and a source diffusion layer 28b are asymmetrically formed. In the memory cell array, the impurity region of one conductive type is an n-type impurity region.

The memory cell transistor 44 has a tunnel insulating film 12 formed on the semiconductor substrate 10, a gate electrode 27 formed on the tunnel insulating film 12 and extending in the row direction across device forming regions 17 and device isolation regions 18, the drain diffusion layer 28a formed in a device forming region 17 of the semiconductor substrate 10, and the source diffusion layer 28b formed in a device forming region 17 of the semiconductor substrate 10 on the side of the gate electrode 27 opposite to the drain diffusion layer 28a.

The gate electrodes 27 extending in the row direction are arranged alternately at a first interval and a second interval narrower than the first interval. The drain diffusion layer 28a is formed in a device forming region 17 of the first interval, and the source diffusion layer 28b is formed in a device forming region 17 of the second interval.

That is, the source diffusion layer 28b has a width in the column direction narrower than the drain diffusion layer 28a (in other words, the drain diffusion layer 28a has a width in the column direction wider than the source diffusion layer 28b).

One memory cell transistor 44 shares the source diffusion layer 28b with another memory cell transistor 44 located adjacent thereto on one side thereof in the column direction and shares the drain diffusion layer 28a with another memory cell transistor 44 located adjacent thereto on the other side thereof in the column direction.

All the gate electrodes 27 have an equal width in the column direction (or an equal width in the channel length direction). As a result, all the memory cell transistors 44 can have substantially the same electrical characteristics. The gate electrode 27 has a floating gate 13 formed on the tunnel insulating film 12, a floating gate 19 formed on the floating gate 13, an insulating film between gates 20 formed on the stack of the floating gates 13 and 19, and a control gate 21 formed on the insulating film between gates 20.

A silicon nitride layer 23 is formed on the control gate.

In addition, a silicon oxide layer 24 is formed on the opposite sides of the gate electrode 27.

The first contact plug 37a is connected to the drain diffusion layer 28a of the memory cell transistor 44. The first contact plug 37a is wider in the column direction at upper parts thereof connected to the drain diffusion layer 28a than at lower parts thereof connected to the second contact plug 40.

The local interconnection wiring 37b having the shape of a groove is easier to form than the first contact plug 37a having the shape of a column. Therefore, a desired conductivity is more easily achieved between the local interconnection wiring 37b and the source diffusion layer 28b than between the first contact plug 37a and the drain diffusion layer 28a.

Thus, by making the width of the drain diffusion layer 28a in the column direction wider than the width of the source diffusion layer 28b in the column direction as described above, the conductivity between the first contact plug 37a and the drain diffusion layer 28a is improved.

In this way, the controllability of the memory cells can be improved while maintaining the size of the memory cells.

In FIGS. 2 and 3, the width of the bottom of the second contact plug 40a in the column direction is narrower than the width of the top of the first contact plug 37a.

However, the width of the bottom surface of the second contact plug 40a in the column direction may be equal to or wider than the width of the top surface of the first contact plug 37a. In that case, the conductivity between the first contact plug 37a and the second contact plug 40a is improved, and the controllability of the memory cell is also improved.

The bit line 41 ("BL") is formed to extend in the column direction. The bit line 41 is connected to the first contact plug 37a located therebelow via the second contact plug 40a connected between the first contact plug 37a and the bit line 41 ("BL"). The drain contact "DC" is composed of the first contact plug 37a and the second contact plug 40a.

The common source line 42 ("CSL") is formed to extend in the column direction and is connected to the local interconnection wiring 37b via a third contact plug 40b.

The local interconnection wiring 37b is formed to extend in the row direction and is connected to the source diffusion layer 28b of the memory cell transistor 44.

The word line "WL" extending in the row direction of the memory cell array passes across the device forming regions 17 and the device isolation regions 18. The word line "WL" serves also as the gate electrode of the memory cell transistor 44 and has a two-layer gate structure.

A method of manufacturing the NOR flash memory 100 having the configuration described above will be described with reference to FIGS. 3 to 16.

Figure 15:
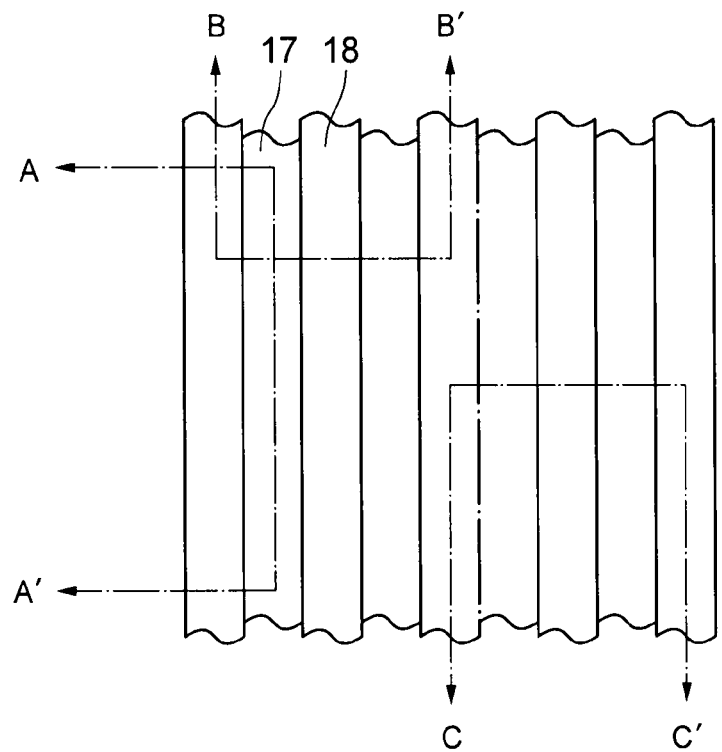
FIG. 15 is a plan view of a memory cell array region of the NOR flash memory 100 in the manufacturing step shown in FIG. 6.
Figure 16:
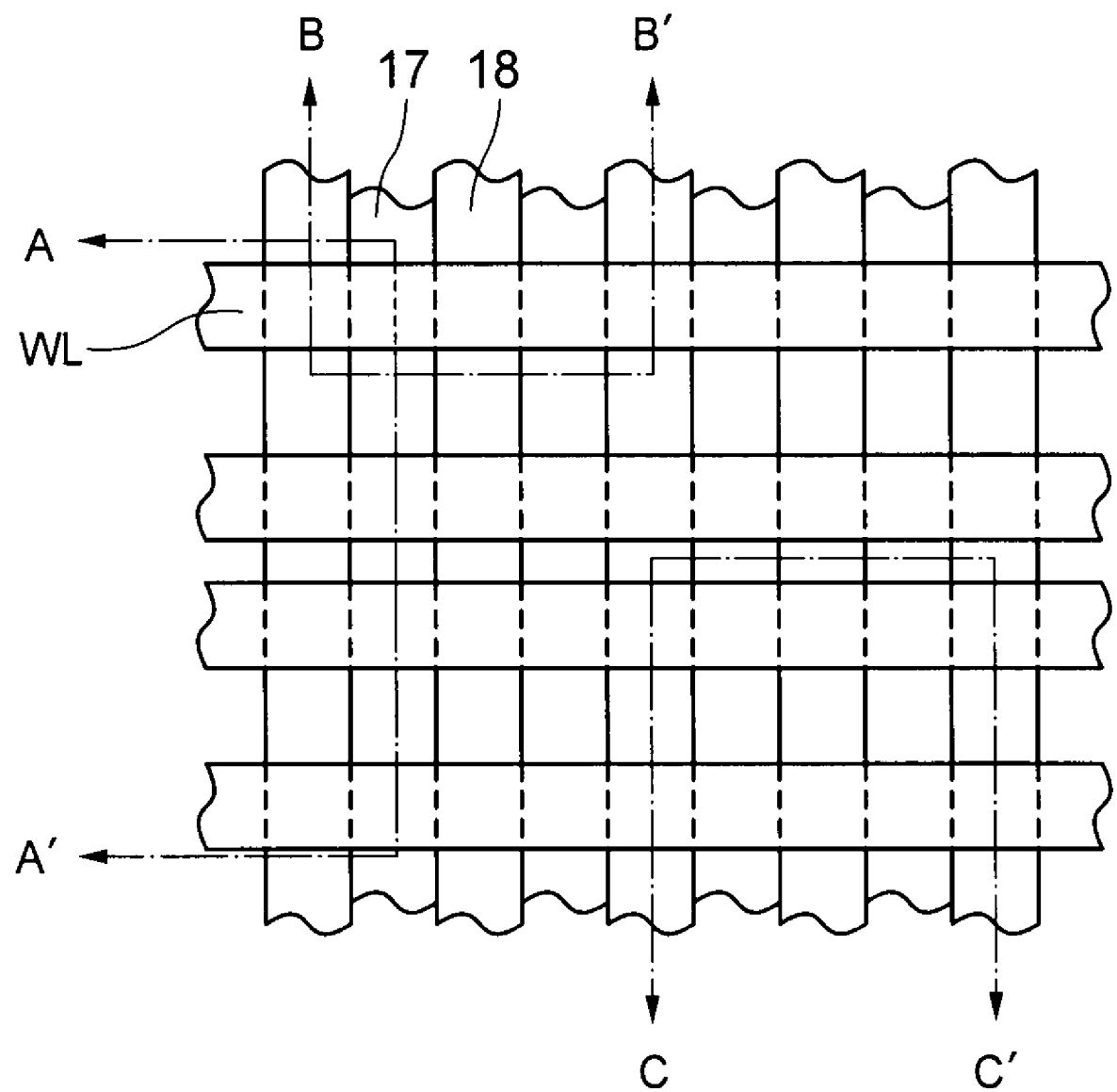
FIG. 16 is a plan view of the memory cell array region of the NOR flash memory 100 in the manufacturing step shown in FIG. 8.

FIGS. 4 to 14 are cross-sectional views for illustrating different steps of a method of manufacturing the NOR flash memory 100 according to the embodiment 1. FIG. 15 is a plan view of a memory cell array region of the NOR flash memory 100 in the manufacturing step shown in FIG. 6. FIG. 16 is a plan view of the memory cell array region of the NOR flash memory 100 in the manufacturing step shown in FIG. 8.

FIGS. 4(A) to 14(A) are cross-sectional views taken along the line A-A' in FIG. 2 (showing a cross-sectional structure taken in the channel length direction of the memory cell). FIGS. 4(B) to 14(B) are cross-sectional views taken along the line B-B' in FIG. 2 (showing a cross-sectional structure taken in the channel width direction of the memory cell). FIGS. 4(C) to 14(C) are cross-sectional views taken along the line C-C' in FIG. 2 (showing a cross-sectional structure of the drain contact layer of the memory cell).

As shown in FIGS. 4(A) to 4(C), a first silicon oxide layer 12, which is referred to as tunnel insulating film, is formed on a principal surface of a semiconductor substrate 10. Furthermore, a first polysilicon layer 13, which constitutes a floating gate electrode of a cell in a subsequent step, is deposited on the first silicon oxide layer 12. Furthermore, a first silicon nitride layer 14 is formed on the first polysilicon layer 13, and a second silicon oxide layer 15 is formed on the first silicon nitride layer 14.

In this embodiment, the semiconductor substrate 10 is a p-type silicon substrate, and in an area in which memory cells are formed, a deep n-type well region is formed, and then a p-type well region 11 is formed.

As shown in FIGS. 5(A) to 5(C), a trench 16 is formed at a part to form a device isolation region. In this step, a resist pattern (not shown) having an opening to form the device isolation region is formed on the second silicon oxide layer 15 by photolithography. The resist pattern is a stripe pattern of openings extending in the column direction of the memory cell array. Using the resist pattern as a mask, the second silicon oxide layer 15 and the first silicon nitride layer 14 are etched by reactive ion etching (RIE).

Then, using the etched second silicon oxide layer 15 and the etched first silicon nitride layer 14 as a mask, the first polysilicon layer 13, the first silicon oxide layer 12 and the semiconductor substrate 10 are etched by RIE to form the trench 16. The trench 16 is deeper than the p-type well 11 for the purpose of device isolation.

Then, a buried insulating layer is deposited to fill the trench 16 to sufficiently bury the stack of the first silicon oxide layer 12, the first polysilicon layer 13, the first silicon nitride 14 and the second silicon oxide layer 15. The buried insulating film is a silicon oxide film. The silicon oxide film is deposited by plasma CVD of a $SiH_4$-$N_2O$-based gas or a tetraethylorthosilicate(TEOS)-$O_2$-based-gas, for example.

Then, using the first silicon nitride layer 14 as a stopper, the deposited oxide silicon film and the second silicon oxide layer 15 are polished by chemical mechanical polishing (CMP) to planarize the surface. This polishing removes the second silicon oxide layer 15 as well as the buried insulating film and makes the top surfaces of the first silicon nitride layer 14 and the buried insulating film flush with each other.

Figure 6:
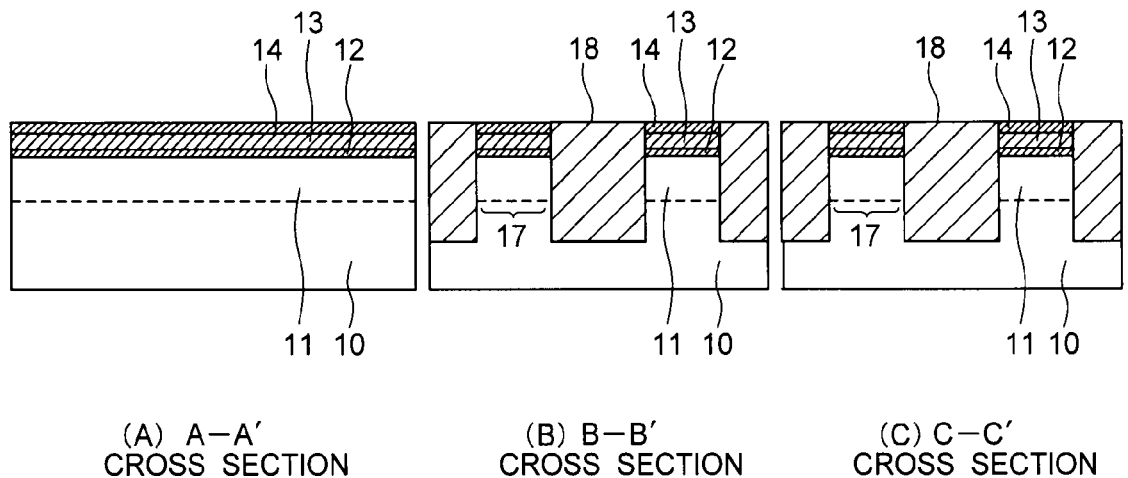
FIG. 6 is a cross-sectional view for illustrating a step of the method of manufacturing the NOR flash memory 100 according to the embodiment 1 and is continuous with FIG. 5.
Figure 7:
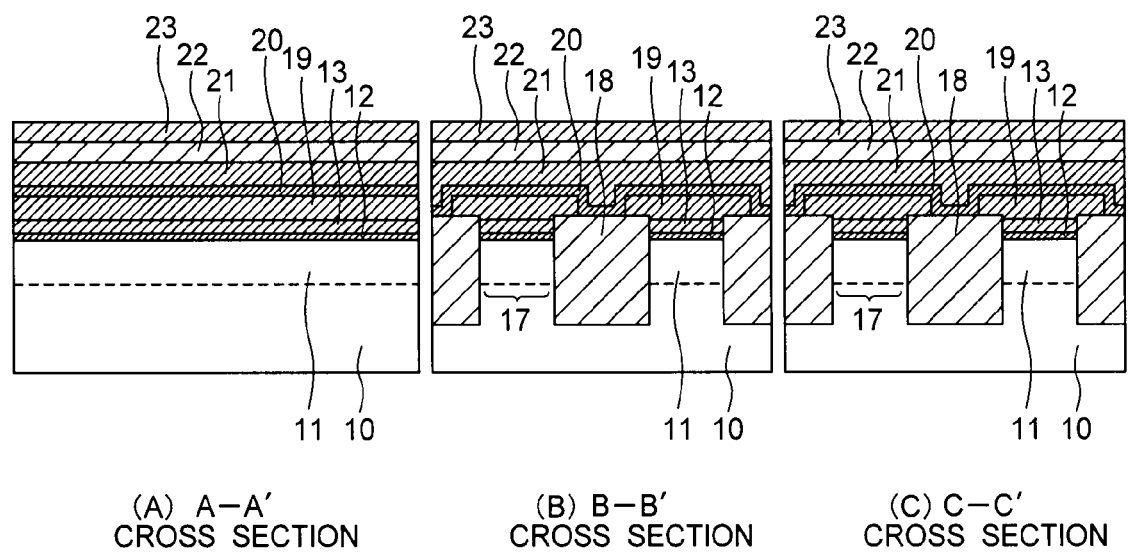
FIG. 7 is a cross-sectional view for illustrating a step of the method of manufacturing the NOR flash memory 100 according to the embodiment 1 and is continuous with FIG. 6.

As a result, as shown in FIG. 6, a device isolation region (device isolation insulating film) 18 based on the STI technique having the trench 16 filled with the silicon oxide film is formed. More specifically, the device isolation region 18 that extends in the column direction and separates device forming regions 17 on the semiconductor substrate 10 are formed.

As shown in FIG. 15, a stripe pattern of device isolation regions 18 is formed in the column direction of the memory cell array, and device forming regions 17 are formed between adjacent two of the device isolation regions 18. In the device forming region 17, the first silicon oxide layer 12, the first polysilicon layer 13, and the first silicon nitride layer 14 are stacked.

As shown in FIGS. 7(A) to 7(C), a process of forming a two-layer gate structure is conducted. From the stack shown in FIG. 6 described above, the first silicon nitride layer 14 is removed by phosphate treatment. Then, a second polysilicon layer 19 is formed. For example, using $SiH_2Cl_2$, $HC_1$ and $PH_3$ as a material gas, a polysilicon film added with phosphor, which is deposited by low pressure CVD, is deposited. The film is dry-etched using a resist pattern formed by photolithography so that the film is divided on the top of the device isolation region 18 to form second polysilicon layers 19.

In this way, the first polysilicon layer 13 and the second polysilicon layer 19 are stacked and used as a floating gate 13 and a floating gate 19 of the memory cell, respectively. As shown in FIGS. 7(B) and 7(C), the stack of the floating gates 13 and 19 has a T shape in cross sections taken along the lines B-B' and C-C'.

That is, the floating gates 13 and 19 are provided for each memory cell and insulated from the adjacent memory cells.

Then, an ONO layer, which is a stack of a silicon oxide layer, a silicon nitride layer and a silicon oxide layer, for example, is formed by low pressure CVD an insulating film between gates 20. Furthermore, a third polysilicon layer 21 added with phosphor and a tungsten silicide (WSi) layer 22 are formed. The tungsten silicide layer 22 is deposited by CVD using $WF_6$ and $SiH_4$, for example. Furthermore, a third silicon nitride layer 23, which is used as a gate CAP material when a two-layer gate electrode is formed in a subsequent step, is deposited.

As shown in FIGS. 8(A) to 8(C), a two-layer gate electrode composed of a floating gate and a control gate is formed.

First, a resist pattern is formed by photolithography. The resist pattern is a pattern corresponding to the word lines "WL" extending in the row direction of the memory cell array. Using this resist pattern, the third silicon nitride layer 23, the tungsten silicide layer 22, the third polysilicon layer 21, the insulating film between gates 20, the second polysilicon layer 19, and the first polysilicon layer 13 are anisotropically etched by RIE to form gate electrodes 27. That is, gate electrodes 27 extending in the row direction and passing across the device isolation regions 18 and the device forming regions 17 are formed.

The gate electrodes 27 are arranged in the column direction alternately at a first interval and at a second interval narrower than the first interval. That is, the source region is formed in the narrower second interval on the semiconductor substrate 10, and the drain region is formed in the wider first interval on the semiconductor substrate 10, so that the source region and the drain region are asymmetrical to each other. In the subsequent steps, the gate forms a self-aligned contact with the source and the drain on the both sides thereof. All the gate electrodes 27 have the same width.

As shown in FIGS. 9(A) to 9(C), side wall spacers 26 are formed on the side walls of the gate electrode 27. First, a fourth silicon oxide layer 24 having a desired thickness is formed on each side surface of the first polysilicon layer 13, the second polysilicon layer 19, the third polysilicon layer 21 and the tungsten silicide layer 22 forming the gate electrode 27 by an oxidation processing. After that, an impurity region is formed.

In this embodiment, as an example, there will be described a case where a low-concentration n-type impurity region 25 forming a low-concentration drain (LDD) is formed in addition to a high-concentration n-type impurity region 28 forming the drain region (drain diffusion layer) and the source region (source diffusion layer) of the memory cell.

After the fourth silicon oxide layer 24 is formed, in order to form the low-concentration drain (LDD) of the memory cell, ion implantation is conducted using the gate electrode 27 as a mask to form the low-concentration n-type impurity region 25.

Then, for example, a silicon nitride film is deposited to bury the gate electrode 27, and then the silicon nitride film is etched back to form the side wall spacers 26.

Then, using the side wall spacers 26 as a mask, ion implantation is conducted to form a high-concentration n-type impurity region (drain diffusion layer) 28a and a high-concentration n-type impurity region (source diffusion layer) 28b.

In this way, the low-concentration n-type impurity regions 25 are formed in the parts below the side wall spacers 26 in the device forming regions 17 on the opposite sides of the gate electrode 27, and the drain diffusion layer 28a and the source diffusion layer 28b, which are high-concentration impurity regions, are formed on the outer sides of the side wall spacers 26.

Since the drain diffusion layer 28a is formed in the device forming region of the first interval and the source diffusion layer 28b is formed in the device forming region of the second interval in this way, the width of the source diffusion layer 28b in the column direction is narrower than the width of the drain diffusion layer 28a in the column direction.

Figure 8:
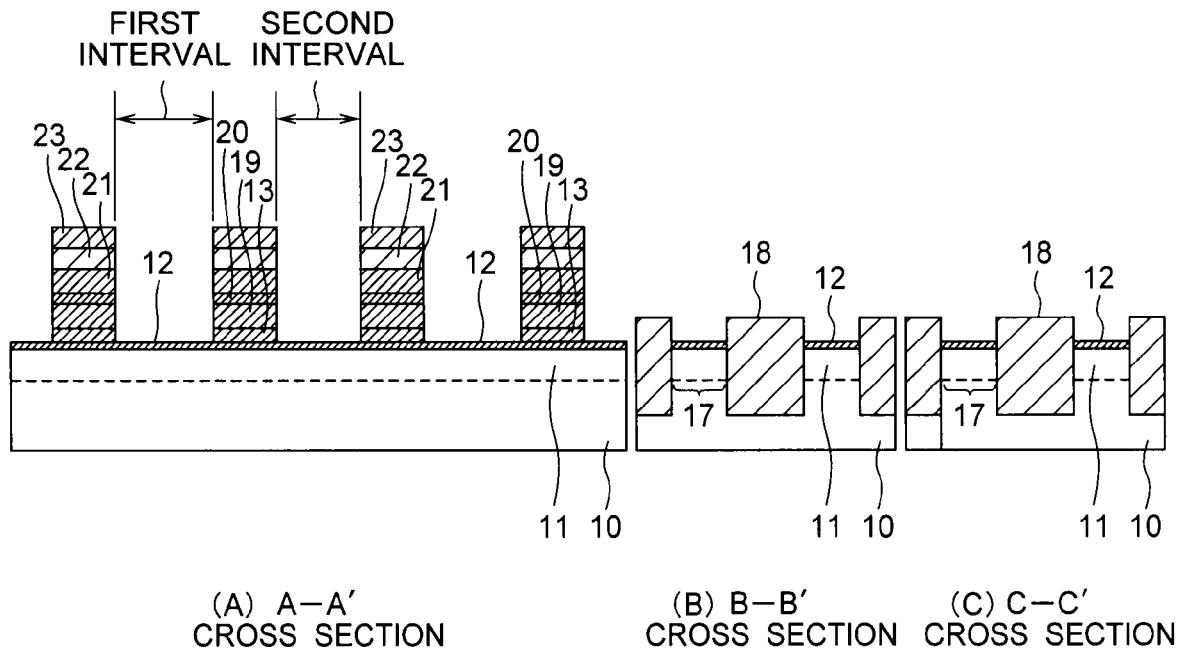
FIG. 8 is a cross-sectional view for illustrating a step of the method of manufacturing the NOR flash memory 100 according to the embodiment 1 and is continuous with FIG. 7.
Figure 9:
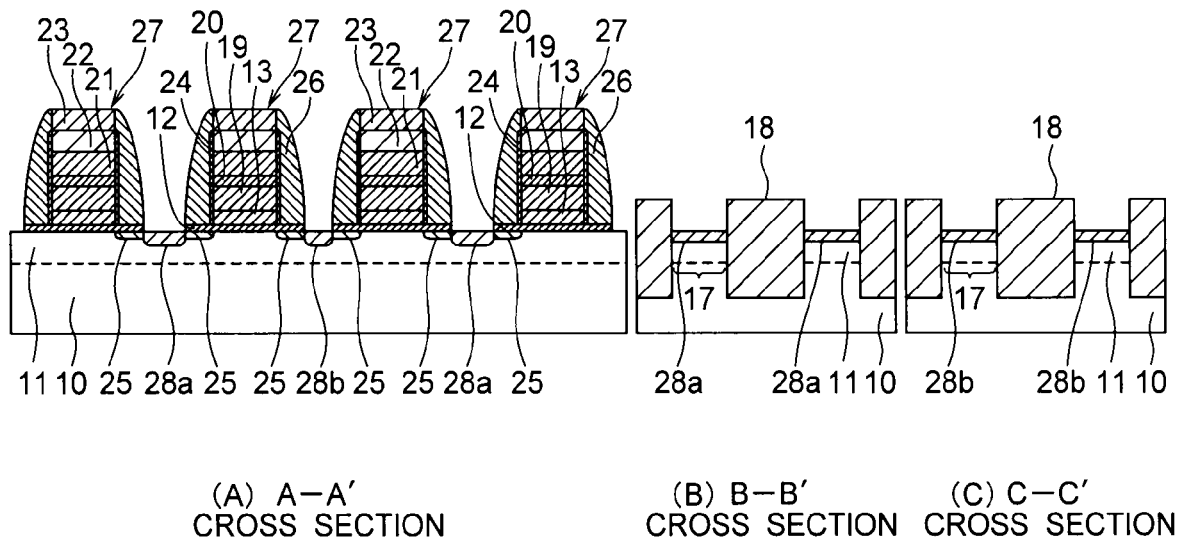
FIG. 9 is a cross-sectional view for illustrating a step of the method of manufacturing the NOR flash memory 100 according to the embodiment 1 and is continuous with FIG. 8.
Figure 10:
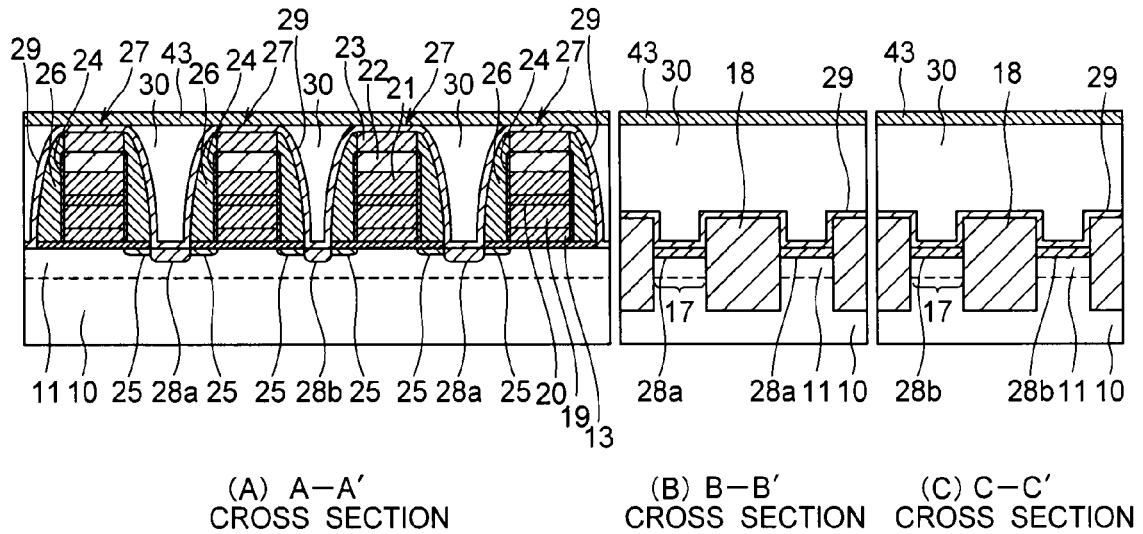
FIG. 10 is a cross-sectional view for illustrating a step of the method of manufacturing the NOR flash memory 100 according to the embodiment 1 and is continuous with FIG. 9.
Figure 11:
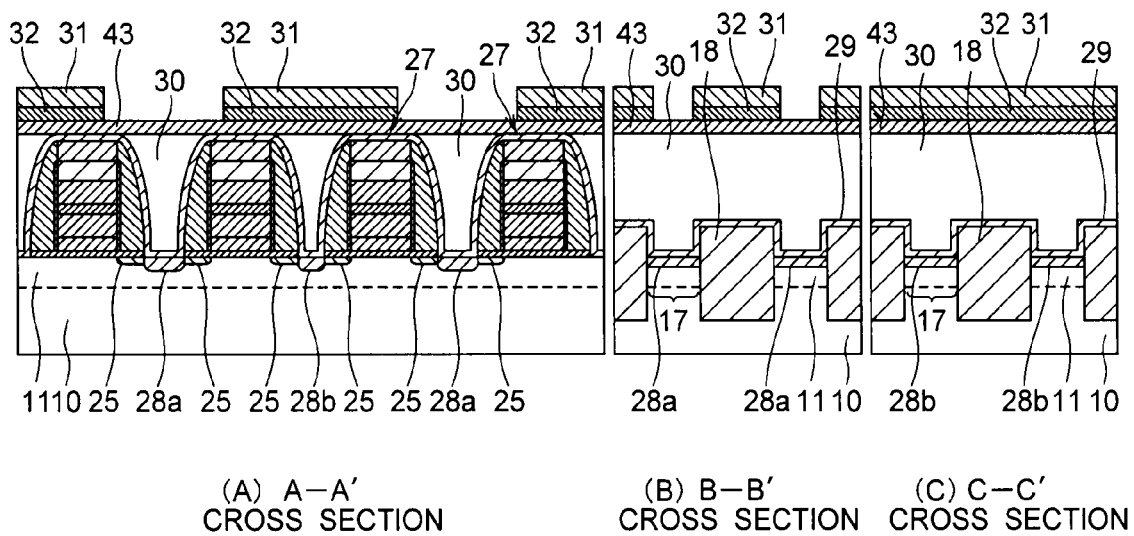
FIG. 11 is a cross-sectional view for illustrating a step of the method of manufacturing the NOR flash memory 100 according to the embodiment 1 and is continuous with FIG. 10.

The third polysilicon layer 21 and the tungsten silicide (WSi) layer 22 of the gate electrodes 27 formed in the steps shown in FIGS. 8 and 9 extend in the row direction across the device forming regions 17 and the device isolation regions 18 and connect the floating gates in the row direction via the insulating film between gates 20, thereby functioning as the word line "WL".

The interval in which the drain contact layer is formed is made wider than the interval in which the local interconnection wiring is formed, so that source and drain openings are formed asymmetrically.

Then, as shown in FIGS. 10(A) to 10(C), a second silicon nitride layer 29 and an interlayer insulating film 30 are formed.

First, the second silicon nitride layer 29 as an etching stopper when a contact opening is formed, is formed. On the second silicon nitride layer 29, a boron phosphor silicate glass (BPSG) film is deposited by atmospheric pressure CVD using $SiH_4$, $B_2H_6$, $PH_3$ and $O_2$ gasses. The deposited BPSG film is reflowed, and then, the BPSG film is shaved and planarized by CMP until the top surface is exposed using the second silicon nitride layer 29 as a stopper, thereby forming the interlayer insulating film 30.

That is, the interlayer insulating film 30 is formed on the source diffusion layer 28b and the drain diffusion layer 28a. Furthermore, an interlayer insulating film 43 serving as a hard mask is formed above the gate electrode 27 and on the interlayer insulating film 30.

Then, a mask pattern for forming the drain contact is formed. The mask pattern has a self-aligned structure with respect to the gate electrode and therefore is positioned to lie over the gate.

As shown in FIGS. 11(A) to 11(C), a drain contact forming window pattern 32 is formed on the interlayer insulating film 30 formed by the BPSG film and the interlayer insulating film 43. The drain contact forming window pattern 32 is formed by photolithography using a resist pattern 31. The resist pattern 31 has a hole-like opening at a part above the drain diffusion layer 28a, and the opening partially overlaps with the top of the gate electrode 27.

Figure 12:
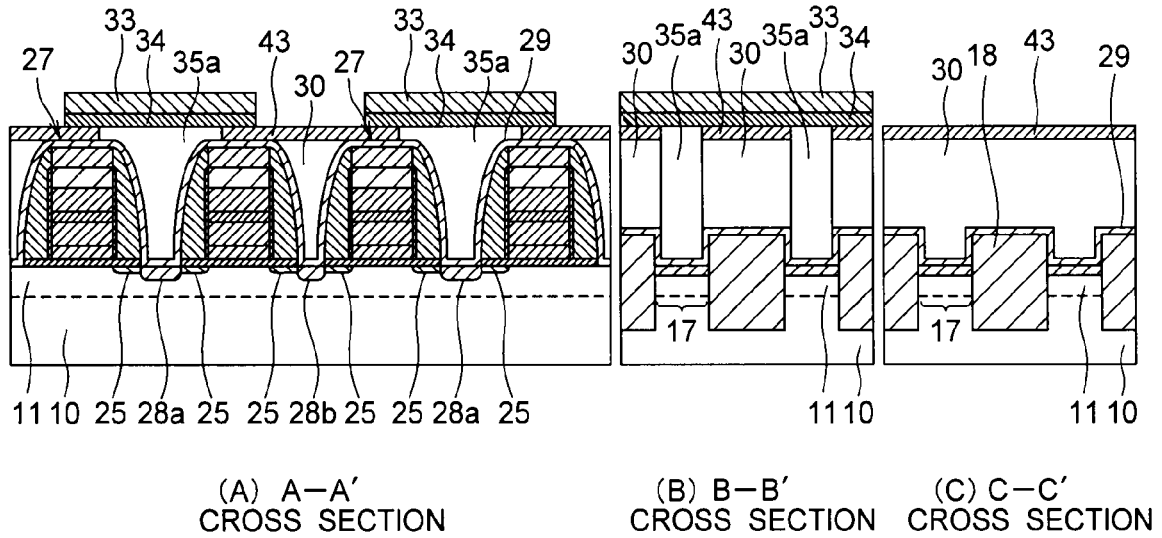
FIG. 12 is a cross-sectional view for illustrating a step of the method of manufacturing the NOR flash memory 100 according to the embodiment 1 and is continuous with FIG. 11.

Using the drain contact forming window pattern 32 having such an opening as a mask, the interlayer insulating films 30 and 43 are etched in a self-aligned manner with respect to the gate electrode, thereby forming a drain contact (contact hole) 35a having a self-aligned structure shown in the cross-sectional view of FIG. 12. More specifically, the drain contact 35a has a cross section tapered from the top toward the bottom along the side wall spacers 26 and is in uniform contact with the drain diffusion layer 28a at the bottom thereof.

The depth of the etching depends on the size of opening of the drain contact forming window pattern 32. That is, to achieve a desired etching depth, the opening of the drain contact forming window pattern 32 has to have a certain area. More specifically, only a hole having a limited depth can be formed through an opening having a small area, and to increase the etching depth, the opening of the drain contact forming window pattern 32 has to be expanded.

As shown in FIGS. 12(A) to 12(C), a source local interconnection forming groove pattern 34 is formed.

The source local interconnection forming groove pattern 34 is formed by photolithography using a resist pattern 33. The mask pattern also has a self-aligned structure with respect to the gate electrode and therefore is positioned to lie over the gate. The resist pattern 33 has an opening in the shape of a groove extending in the row direction above the source diffusion layer 28b, and the opening partially overlaps with the top of the gate electrode 27. The width of the opening of the resist pattern 33 in the column direction is narrower than the width of the opening of the resist pattern 31. Therefore, the width of the opening of the local interconnection forming groove pattern 34 in the column direction is narrower than the width of the opening of the drain contact forming window pattern 32 in the column direction.

Using the resist pattern 33, the local interconnection forming groove pattern 34 is etched.

Figure 13:
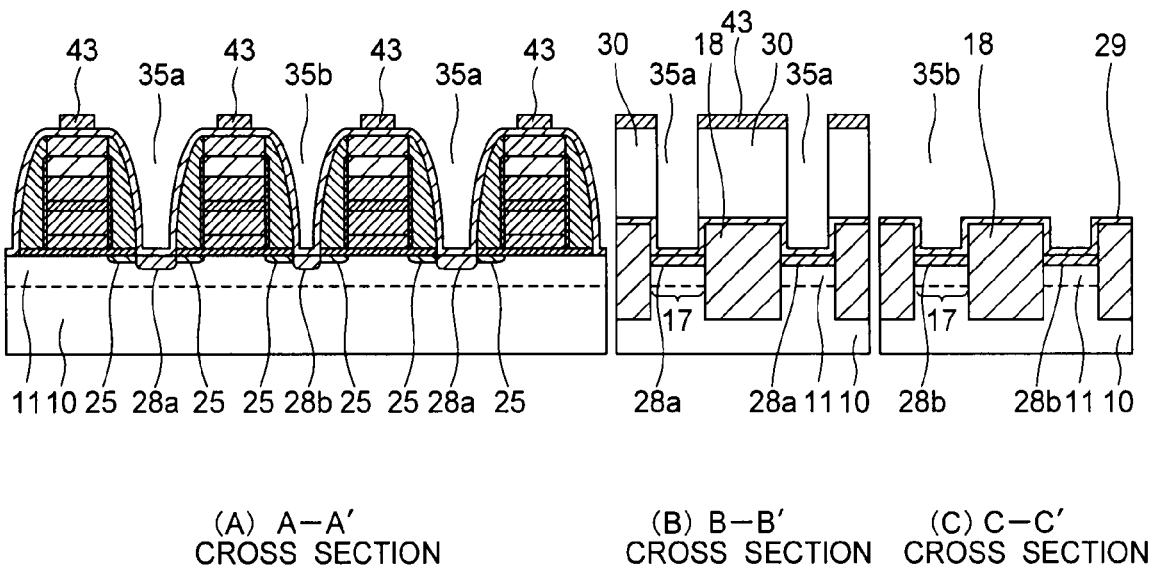
FIG. 13 is a cross-sectional view for illustrating a step of the method of manufacturing the NOR flash memory 100 according to the embodiment 1 and is continuous with FIG. 12.
Figure 14:
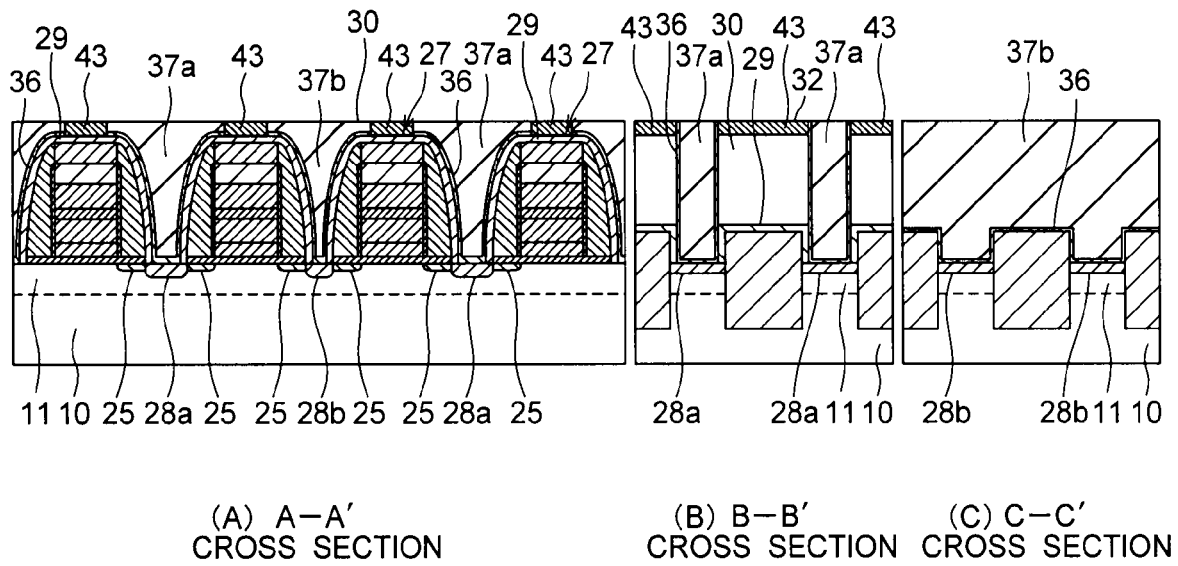
FIG. 14 is a cross-sectional view for illustrating a step of the method of manufacturing the NOR flash memory 100 according to the embodiment 1 and is continuous with FIG. 13.

Then, using the local interconnection forming groove pattern 34 having an opening in the shape of a groove extending in the row direction as a mask, the interlayer insulating films 30 and 43 are etched in a self-aligned manner with respect to the gate electrode. In this way, a source local interconnection groove 35b having a self-aligned structure shown in the cross-sectional view of FIG. 13 is formed.

More specifically, the source local interconnection groove 35b has a cross section tapered from the top toward the bottom defined by the side wall spacers 26 and is in uniform contact with the source diffusion layer 28b at the bottom thereof.

The etching rate for the source local interconnection groove 35b is higher than the etching rate for the drain contact hole 35a.

That is, providing that the drain contact holes 35a separately provided for each bit and the continuous source local interconnection groove 35b have the same total area, the source local interconnection groove 35b can be more easily etched than the drain contact holes 35a.

This means that, if the same manufacturing apparatus is used for etching, the source local interconnection groove 35b can be more easily etched than the drain contact holes 35a even if the width of the local interconnection groove 35b is smaller than the dimension of the drain contact hole 35a.

Thus, the width of the source diffusion layer 28b in the column direction can be narrower than the width of the drain diffusion layer 28a in the column direction.

Thus, for example, the dimension of the upper part of the drain contact hole opening can be increased while maintaining the size of the memory cell by reducing the dimension of the upper part of the source local interconnection groove.

As shown in FIGS. 13(A) to 13(C), using the drain contact forming window pattern 32 and the source local interconnection forming groove pattern 34, the interlayer insulating films 30 and 43 is etched by RIE using the second silicon nitride layer 29 as a stopper, thereby forming a contact hole 35.

Then, the second silicon nitride layer 29 at the bottom of the contact hole 35 is removed to expose the high-concentration n-type impurity regions 28a and 28b.

In this embodiment described above, as shown in FIGS. 11 to 13, the interlayer insulating films 30 and 43 are etched to form the drain contact hole 35a using the drain contact forming window pattern 32 as a mask, and then, the interlayer insulating film 30 is etched to form the source local interconnection groove 35b using the source local interconnection forming groove pattern 34 as a mask.

However, the order of formation can be reversed. That is, the interlayer insulating films 30 and 43 can be etched to form the source local interconnection groove 35b using the source local interconnection forming groove pattern 34 as a mask, and then, the interlayer insulating film 30 can be etched to form the drain contact hole 35a using the drain contact forming window pattern 32 as a mask.

More specifically, the interlayer insulating films 30 and 43 can be first etched in a self-aligned manner with respect to the gate electrode using the source local interconnection forming groove pattern 34 having an opening having the shape of a groove extending in the row direction as a mask, thereby forming the local interconnection groove 35b that penetrates through the source diffusion layer 28b and passes across the device isolation regions 18 and the device forming regions 17. After that, the interlayer insulating film 30 can be etched in a self-aligned manner with respect to the gate electrode using as a mask the drain contact forming window pattern 32 having a hole-like opening having a width in the column direction larger than the width of the opening of the source local interconnection forming groove pattern 34 in the column direction, thereby forming the contact hole 35a that penetrates through the drain diffusion layer 28a.

Furthermore, to reduce the number of steps of the manufacturing process described above, exposure and development of the resist pattern 31 for the drain and the resist pattern 33 for the source can be conducted at the same time in the photolithography step.

That is, a resist pattern having a first opening for forming the contact hole 35a having the shape of a hole and a second opening for forming the local interconnection groove 35b having the shape of a groove extending in the row direction and having a width in the column direction narrower than the width of the first opening in the column direction is formed in one exposure and development step.

In this case, the contact hole 35a and the source local interconnection groove 35b can be formed in one photolithography step.

Then, the interlayer insulating films 30 and 43 can be etched using the one mask thus formed in a self-aligned manner with respect to the gate electrode, thereby forming the contact hole 35a and the source local interconnection groove 35b at the same time.

More specifically, the interlayer insulating films 30 and 43 are etched using the resist pattern as a mask. Thus, the contact hole 35a penetrating through the drain diffusion layer 28a and the local interconnection groove 35b penetrating through the source diffusion layer 28b and passing across the device isolation regions 18 and the device forming regions 17 can be formed at the same time.

As shown in FIGS. 14(A) to 14(C), a first barrier metal layer 36, a first contact plug (drain contact layer) 37a and local interconnection wiring 37b are formed.

The first barrier metal layer 36 is formed by depositing a titanium film or a titanium nitride film or both the titanium film and the titanium nitride film by sputtering.

Furthermore, a tungsten film is deposited by CVD using tungsten hexafluoride to fill the contact hole 35a and the local interconnection groove 35b.

In this way, after the barrier metal is deposited in the contact hole 35a and the local interconnection groove 35b, the contact plug 37a and the local interconnection wiring 37b are formed.

Then, the exposed part of the tungsten film and the titanium film are planarized by CMP. In this step, the contact plug 37a connected to the drain diffusion layer 28a is formed in the contact hole 35a, and the local interconnection wiring 37b connected to the source diffusion layer 28b is formed in the local interconnection groove 35b.

As shown in FIGS. 3(A) to 3(C) described earlier, a fifth silicon oxide layer 38 is deposited by CVD using TEOS.

Then, a predetermined resist pattern is formed by photolithography.

Then, a contact hole for drawing a bit line signal is formed in the fifth silicon oxide layer 38 by RIE at a part corresponding to the first contact plug 37a, and a contact hole for source potential supply is formed in the fifth silicon oxide layer 38 by RIE at a part corresponding to the local interconnection wiring 37b.

Then, a second barrier metal layer 39 is deposited, and a tungsten film is deposited on the second barrier metal layer 39 to fill the contact hole. Then, the exposed part of the tungsten film and the titanium film is planarized by CMP, thereby forming a second contact plug 40a.

Then, wiring 41 constituting a bit line is formed on the second contact plug 40a connected to the drain region.

In addition, a common source line 42 is formed on a third contact plug 40b connected to the source diffusion layer 28b. In this way, formation of the memory cell device is completed (FIGS. 3(A) to 3(C)).

By the manufacturing process described above, the memory cell array region of the NOR flash memory 100 is formed.

As described above, according to the manufacturing method described above, the width of the source diffusion layer 28b in the column direction can be easily made narrower than the width of the drain diffusion layer 28a in the column direction.

As described above, the NOR flash memory according to this embodiment can have downsized memory cells, and the method of manufacturing the NOR flash memory according to this embodiment can produce downsized memory cells.

What is claimed is:

1. A NOR flash memory, comprising:
    a semiconductor substrate;
    device isolation regions that extend in a column direction, are arranged at predetermined intervals in a row direction and separate device forming regions of the semiconductor substrate from each other;
    a plurality of memory cell transistors comprising a tunnel insulating film formed on the semiconductor substrate, a gate electrode that is formed to extend in the row direction and pass across the tunnel insulating film and the device isolation regions, a drain diffusion layer formed in a device forming region of the semiconductor substrate, and a source diffusion layer formed in the device forming region of the semiconductor substrate on the opposite side of the gate electrode to the drain diffusion layer;
    a first contact plug formed in a self-aligned manner to be connected to the drain diffusion layer of the memory cell transistor;
    a bit line that extends in the column direction and is connected to the first contact plug;
    a local interconnection wiring that is formed in a self-aligned manner to extend in the row direction and to be connected to the source diffusion layer of the memory cell transistor; and
    a common source line connected to the local interconnection wiring,
    wherein each memory cell transistor shares the source diffusion layer with another memory cell transistor adjacent thereto on one side thereof in the column direction and shares the drain diffusion layer with another memory cell transistor adjacent thereto on the other side thereof in the column direction,
    the width of the source diffusion layer in the column direction is narrower than the width of the drain diffusion layer in the column direction, and
    the common source line is connected to the source diffusion layer via the local interconnection wiring.

2. The NOR flash memory according to claim 1, further comprising:
    a second contact plug connected between the first contact plug and the bit line,
    wherein the first contact plug has a larger width in the column direction at an upper part connected to the second contact plug than at a lower part connected to the drain diffusion layer, and
    the bottom surface of the second contact plug has a width in the column direction equal to or larger than the width of the top surface of the first contact plug in the column direction.

* * * * *